(12) United States Patent
Hartman et al.

(10) Patent No.: US 7,281,633 B2
(45) Date of Patent: *Oct. 16, 2007

(54) TOOL-LESS ATTACHMENT BRACKET

(75) Inventors: Corey D. Hartman, Round Rock, TX (US); Wayne E. McKinnon, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/465,953

(22) Filed: Aug. 21, 2006

(65) Prior Publication Data

US 2006/0284038 A1 Dec. 21, 2006

Related U.S. Application Data

(63) Continuation of application No. 11/079,824, filed on Mar. 14, 2005, now Pat. No. 7,093,725, which is a continuation of application No. 10/308,547, filed on Dec. 3, 2002, now Pat. No. 6,866,154.

(51) Int. Cl.
*A47F 7/00* (2006.01)
(52) U.S. Cl. ........................................ 211/26; 211/192
(58) Field of Classification Search ................. 211/26, 211/191, 192, 189, 26.2, 175; 312/223.1, 312/223.2, 257.1; 361/724–727, 729, 735, 361/807, 825, 829
See application file for complete search history.

(56) References Cited

U.S. PATENT DOCUMENTS

| | | | | |
|---|---|---|---|---|
| 3,133,768 A | * | 5/1964 | Klakovich | 384/17 |
| 3,680,711 A | * | 8/1972 | Brucker | 211/105.3 |
| 3,697,034 A | * | 10/1972 | Shell | 248/243 |
| 4,184,726 A | * | 1/1980 | Cox | 312/223.1 |
| 4,406,374 A | * | 9/1983 | Yedor | 211/192 |
| 4,931,907 A | * | 6/1990 | Robinson et al. | 361/727 |
| 5,460,441 A | * | 10/1995 | Hastings et al. | 312/298 |
| 5,505,533 A | * | 4/1996 | Kammersqard et al. | 312/236 |
| 5,546,277 A | * | 8/1996 | Zandbergen | 361/726 |
| 5,571,256 A | * | 11/1996 | Good et al. | 211/26 |
| 5,791,498 A | * | 8/1998 | Mills | 211/26 |
| 5,833,337 A | * | 11/1998 | Kofstad | 312/334.5 |
| 5,850,925 A | * | 12/1998 | Gandre | 211/26 |
| 5,941,621 A | * | 8/1999 | Boulay et al. | 312/334.4 |
| 6,011,701 A | * | 1/2000 | Kopp et al. | 361/818 |
| 6,021,047 A | * | 2/2000 | Lopez et al. | 361/727 |
| 6,021,909 A | * | 2/2000 | Tang et al. | 211/183 |
| 6,070,742 A | * | 6/2000 | McAnally et al. | 211/26 |
| 6,070,841 A | * | 6/2000 | Robinson | 248/220.43 |

(Continued)

*Primary Examiner*—Jennifer E. Novosad
(74) *Attorney, Agent, or Firm*—Baker Botts L.L.P.

(57) ABSTRACT

A system and method are described for tool-lessly attaching a rack slide assembly to a rack. A mounting bracket includes a bracket member with an interface end and an attachment end. The bracket member includes a locating hook extending from an upper portion of the interface end and positioned to engage the first aperture within a mounting unit that contains three apertures. The bracket member also includes an anti-torque tab extending from a lower portion of the interface end and positioned to engage the third aperture within the mounting unit. The bracket member also includes a locking pawl assembly with a pawl pivotally connected to the interface end of the bracket and able to engage and extend through the first aperture within the mounting unit in a position above the locating hook.

13 Claims, 4 Drawing Sheets

U.S. PATENT DOCUMENTS

| | | | |
|---|---|---|---|
| 6,070,957 A * | 6/2000 | Zachrai | 312/334.4 |
| 6,095,345 A * | 8/2000 | Gibbons | 211/26 |
| 6,142,590 A * | 11/2000 | Harwell | 312/223.1 |
| 6,181,549 B1 * | 1/2001 | Mills et al. | 361/683 |
| 6,185,092 B1 * | 2/2001 | Landrum et al. | 361/683 |
| 6,223,908 B1 * | 5/2001 | Kurtsman | 211/26 |
| 6,230,903 B1 * | 5/2001 | Abbott | 211/26 |
| 6,273,534 B1 * | 8/2001 | Bueley et al. | 312/334.8 |
| 6,297,962 B1 * | 10/2001 | Johnson et al. | 361/726 |
| 6,303,864 B1 * | 10/2001 | Johnson et al. | 174/69 |
| 6,305,556 B1 * | 10/2001 | Mayer | 211/26 |
| 6,392,149 B1 * | 5/2002 | Kim et al. | 174/72 A |
| 6,398,041 B1 * | 6/2002 | Abbott | 211/26 |
| 6,422,399 B1 * | 7/2002 | Castillo et al. | 211/26 |
| 6,431,668 B1 * | 8/2002 | Reddicliffe | 312/334.5 |
| 6,435,354 B1 * | 8/2002 | Gray et al. | 211/26 |
| 6,546,684 B2 * | 4/2003 | Waalkes et al. | 52/239 |
| 6,600,648 B2 * | 7/2003 | Curlee et al. | 361/685 |
| 6,685,033 B1 * | 2/2004 | Baddour et al. | 211/26 |
| 6,773,080 B2 * | 8/2004 | Chen et al. | 312/265.1 |
| 6,866,154 B2 * | 3/2005 | Hartman et al. | 211/26 |
| 6,910,306 B2 * | 6/2005 | Waalkes et al. | 52/239 |
| 7,137,512 B2 * | 11/2006 | Nguyen et al. | 211/26 |

\* cited by examiner

TOOL-LESS ATTACHMENT BRACKET

CROSS REFERENCE TO RELATED APPLICATIONS

This application is a continuation of U.S. application Ser. No. 11/079,824 filed Mar. 14, 2005, incorporated by reference herein and entitled "Tool-Less Attachment Bracket", now U.S. Pat. No. 7,093,725, which is a continuation of U.S. application Ser. No. 10/308,547 filed Dec. 3, 2002, incorporated by reference herein and entitled "Tool-Less Attachment Bracket", now U.S. Pat. No. 6,866,154.

TECHNICAL FIELD

The present disclosure relates in general to the field of electronic and computer equipment and more specifically to a rack system including a tool-less attachment bracket.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system components such as servers are often stored within rack systems such as EIA-310 standard racks. Rack systems often include rack slide assemblies attached on either side of a rack for mounting information handling system components. The rack slide assemblies allow the information handling system components to be moved from an installed position within the rack to a position extended from the rack to allow for inspection, maintenance, installation and removal of the information handling system component. Rack slide assemblies may be connected to the rack arm using loose fasteners such as bolts, nuts and screws. However, some rack slide assemblies use tool-less hook and latch mechanisms to secure the rack slide assemblies to the rack systems.

FIG. 1 shows one such prior art tool-less rack slide assembly attachment bracket. The attachment bracket shows a latch portion interfaced with the top aperture within a mounting unit, a hook portion extending through the second aperture within a mounting unit and a support tab inserted in the third aperture within the mounting unit. One significant problem is that this type of attachment bracket can fail when experiencing a high torque load. Torque loads can occur during installation or removal of the rack slide assemblies within the rack and also during installation and removal of information handling system components with respect to the slide assemblies. In particular, this is a problem that is significant for rack slide assemblies designed to fit in a 1-U envelope, allowing for significant tortional deflection over the height of the bracket.

SUMMARY

Therefore a need has arisen for a system and method for attaching a rack slide assembly within a rack able to accommodate increased torque loads.

A further need has arisen for an attachment bracket for tool-lessly connecting a torque load resistant 1-U slide assembly.

In accordance with teachings of the present disclosure, a system and method are described for tool-lessly attaching a rack slide assembly to a rack. In one embodiment a mounting bracket is disclosed that includes a bracket member with an interface end and an attachment end. The bracket member includes a locating hook extending from an upper portion of the interface end and positioned to engage the first aperture within a mounting unit that contains three apertures. The bracket member also includes an anti-torque tab extending from a lower portion of the interface end and positioned to engage the third aperture within the mounting unit. The bracket member also includes a locking pawl assembly with a pawl pivotally connected to the interface end of the bracket and able to engage and extend through the first aperture within the mounting unit in a position above the locating hook. More specifically the bracket includes an outer attachment aperture formed within the interface and positioned to align with the second aperture within the mounting unit.

The present disclosure includes a number of important technical advantages. One technical advantage is including a locating hook formed to align with the first aperture within a mounting unit and also providing a locking pawl assembly with a locking pawl positioned to extend through the first aperture within the mounting unit. Providing the locating hook and locking pawl positioned to interface within the same mounting unit and also providing a locking tab positioned to interface with third aperture within a mounting unit facilitates the support of increased torque loads. A number of other important technical advantages are described in the figures, descriptions, and claims that follow.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 5, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
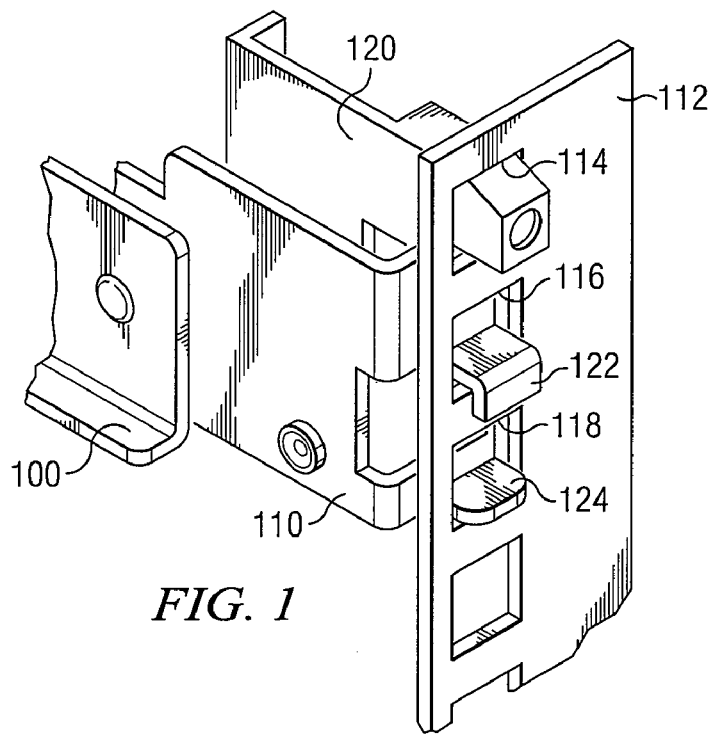
FIG. 1 is an isometric view of a prior art attachment bracket.

Now referring to FIG. 1, an isometric view of a prior art mounting bracket depicted generally at 100 is shown. Mounting bracket 100 includes bracket member 110 which includes tab 124 and hook 122 extending therefrom. Additionally, locking pawl assembly 120 is movably disposed adjacent to bracket member 110. Bracket 110 is formed to interface with rack rail 112. Rack rail 112 includes a plurality of mounting apertures that form a plurality of mounting units wherein each mounting unit contains a first aperture, a second aperture and a third aperture such as first aperture 114, second aperture 116 and third aperture 118. Bracket 110 interfaces with rack rail 112 such that pawl 120 interfaces with first aperture 114, hook 122 interfaces with second aperture 116 and tab 124 interfaces with aperture 118.

Figure 2:
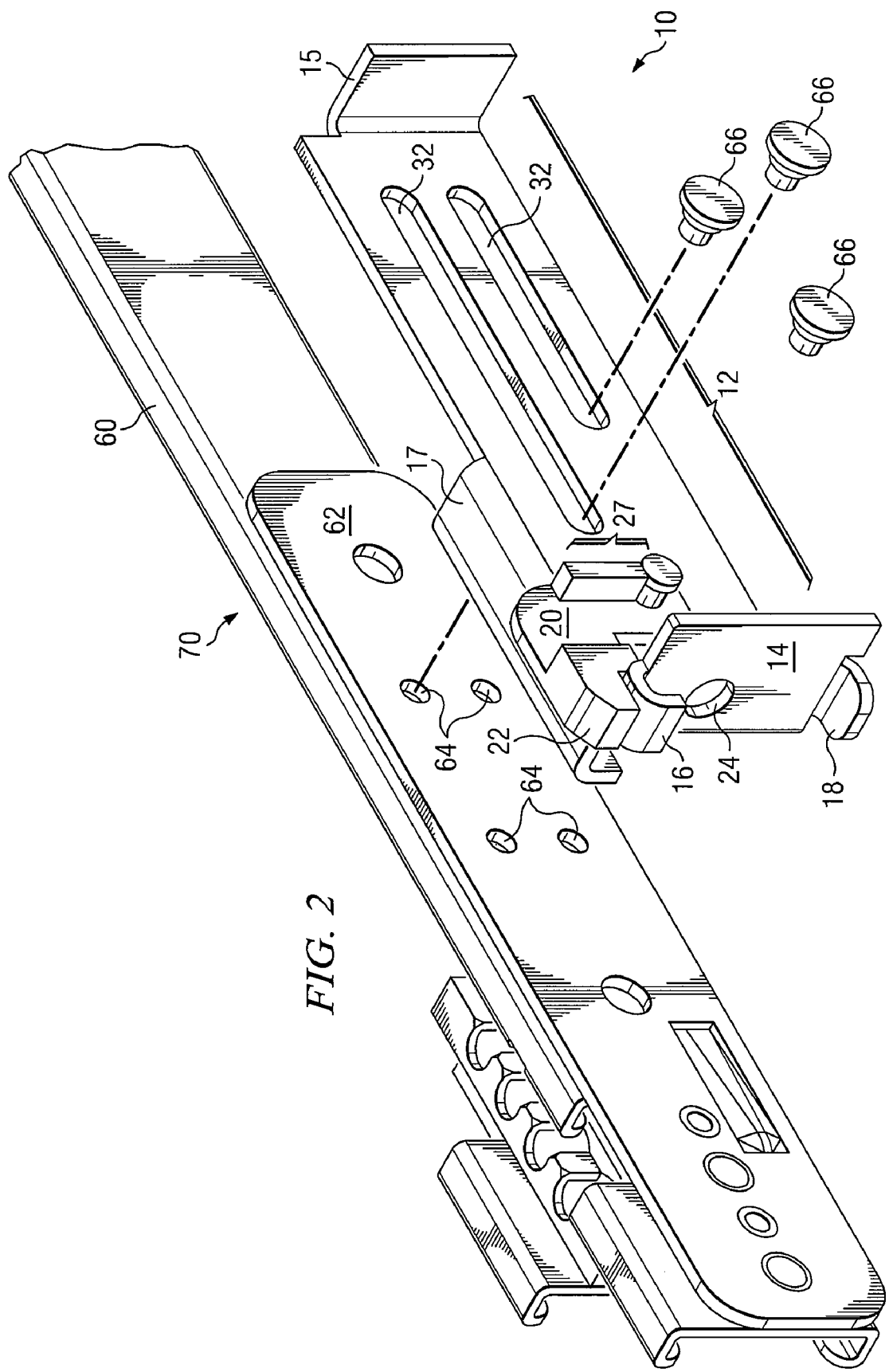
FIG. 2 is an isometric view of a bracket member connected with a portion of the rack rail with portions removed according to teachings of the present disclosure.

Now referring to FIG. 2, an isometric view of bracket member 10 in relation to rack slide assembly 60 is shown. Bracket member 10 includes body 12 which may also be referred to generally as the attachment end of bracket member 10. Bracket member 10 also includes face or interface end 14 which extends substantially perpendicular with respect to body 12. The present embodiment of bracket member 10 also includes back face 15 which also extends perpendicular with respect to body 12 on the end opposite face 14. In alternative embodiments, bracket member 10 may not include a back face 15.

Face 14 includes anti-torque tab 18 extending from a lower portion thereof and locating hook 16 extending from an upper portion of face 14. Locating hook 16 is generally formed to extend outward and then downward to allow a sufficient gap between the downward portion of locating hook 16 and face 14 to interface with a portion of rack rail 50. Face 14 also includes outer attachment aperture 24 formed therein in a centralized position within face 14 between locating hook 16 and anti-torque tab 18. In a preferred embodiment, outer attachment aperture 24 is threaded to receive a threaded fastener. The threaded fastener acts to secure outer attachment aperture 24 to second aperture 54, thereby securing bracket member 10 to rack rail 50.

Locking pawl assembly 20 is pivotally attached to bracket member 10. Locking pawl assembly 20 includes a moveable pawl or latch that includes locking portion 22. Locking pawl assembly 20 is moveable between a locked position (as shown) and a released position. Locking pawl assembly 20 preferably includes release tab 27 for moving locking assembly 20 to the released position.

Bracket member 10 also includes lip 17 extending substantially perpendicular to body 12. Lip 17 is formed to provide additional support for the interconnection of bracket member 10 with rack slide assembly 60. Lip 17 extends substantially perpendicular to body 12 and also forms a downward portion in order to interact with a portion of rack slide assembly 60. It should be noted that the present disclosure contemplates bracket members 10 that do not include a lip portion 17. For instance, the bracket member shown in FIG. 4 does not include a lip 17.

In the present embodiment, bracket member 10 also includes rack arm attachment apertures 32. In the present embodiment rack arm attachment apertures 32 comprise elongated slots formed along the length of body 12. In this embodiment rack arm attachment apertures 32 facilitate longitudinal adjustment of bracket member 10 with respect to slide assembly 60. In alternative embodiments, rack arm attachment apertures 32 may consist of simple holes. Additionally, in some embodiments rack slide assembly 60 may include a bracket member disposed on both ends of rack slide assembly 60. In such an embodiment one of the two bracket members may include a rack arm having attachment apertures 32 that consist of elongated slots while the second bracket member may include rack arm attachment apertures 32 that consist of holes.

Rack slide assembly 60 includes mount 62 attached to rack slide stationary member 70. A rack slide chassis member may be slidably engaged with rack slide stationary member 70 (as shown in FIG. 4). In some embodiments an additional rack slide intermediate member (not expressly shown) may be disposed between rack slide stationary member 70 and rack slide chassis member 68 such that rack slide chassis member 68 may extend and telescope from rack slide stationary member 70. Mount 62 includes a plurality of apertures 64. Apertures 64 are formed to align with rack arm attachment apertures 32 to allow fasteners such as rivets 66 to secure bracket member 10 to rack slide assembly 60.

Rack slide assembly 60 is preferably utilized in pairs with equipment racks such as Electronics Industry Association standard 310 compliant equipment racks and used to house information handling system components. In one particular preferred embodiment, rack slide stationary member 70 is designed to support a so called 1-U information handling system component such as a 1-U server.

Figure 3:
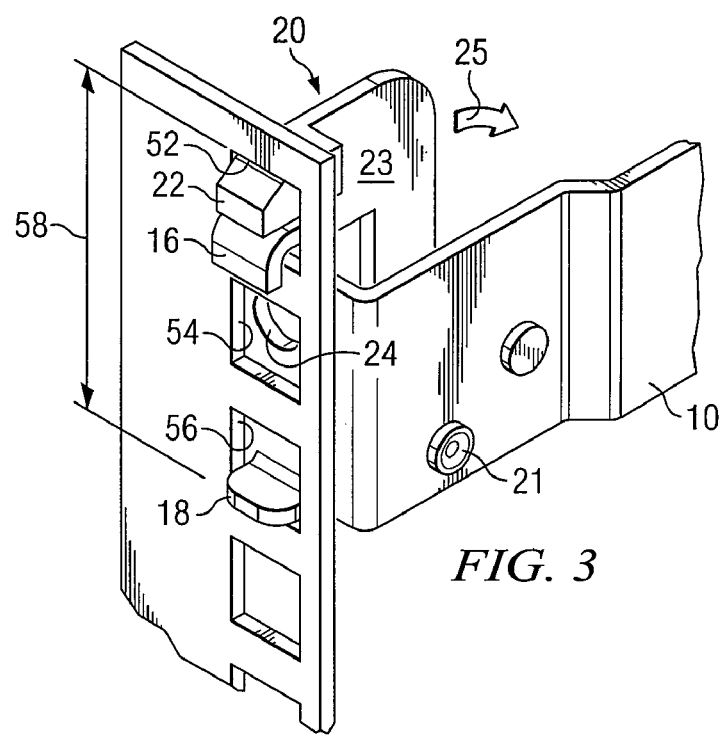
FIG. 3 is an isometric view showing a mounting bracket and a rack slide assembly with portions removed.

Now referring to FIG. 3, an isometric view of a portion of a bracket member 10 engaged with a rack rail 50. Rack rail 50 is an EIA-310 standard compliant rack rail that is defined in a plurality of mounting units or "U's" such as mounting unit 58. Mounting unit 58 includes a first aperture 52, second aperture 54 and third aperture 56. Mounting unit 58 spans approximately 1.75 vertical inches.

Bracket member 10 interacts and engages with rack rail 50 such that locating hook 16 is engaged with and extends through first aperture 52. Additionally the anti-torque tab 18 extends through third aperture 56 and outer attachment aperture 24 aligns with second aperture 54 of mounting unit 58. Locking pawl assembly 20 includes locking portion 22. As shown, locking pawl assembly 20 is in an engaged position 23 where locking portion 22 extends through and engages first aperture 52. Locking pawl assembly 20 may pivot in the direction of arrow 25 into an unlocked or disengaged position in the direction of arrow 25 wherein locking portion 22 disengaged from first aperture 52. Further, locking pawl assembly 20 pivots about pawl pivot point 21.

Locking pawl assembly 20 preferably includes a spring assembly that urges locking pawl assembly 20 into engaged position 23. However, a user may selectively position locking pawl assembly into a disengaged position by moving locking pawl assembly 20 in the direction of arrow 25 preferably by applying pressure in the direction of arrow 25 to a release tab such as release tab 27 shown in FIG. 2.

Figure 4A:
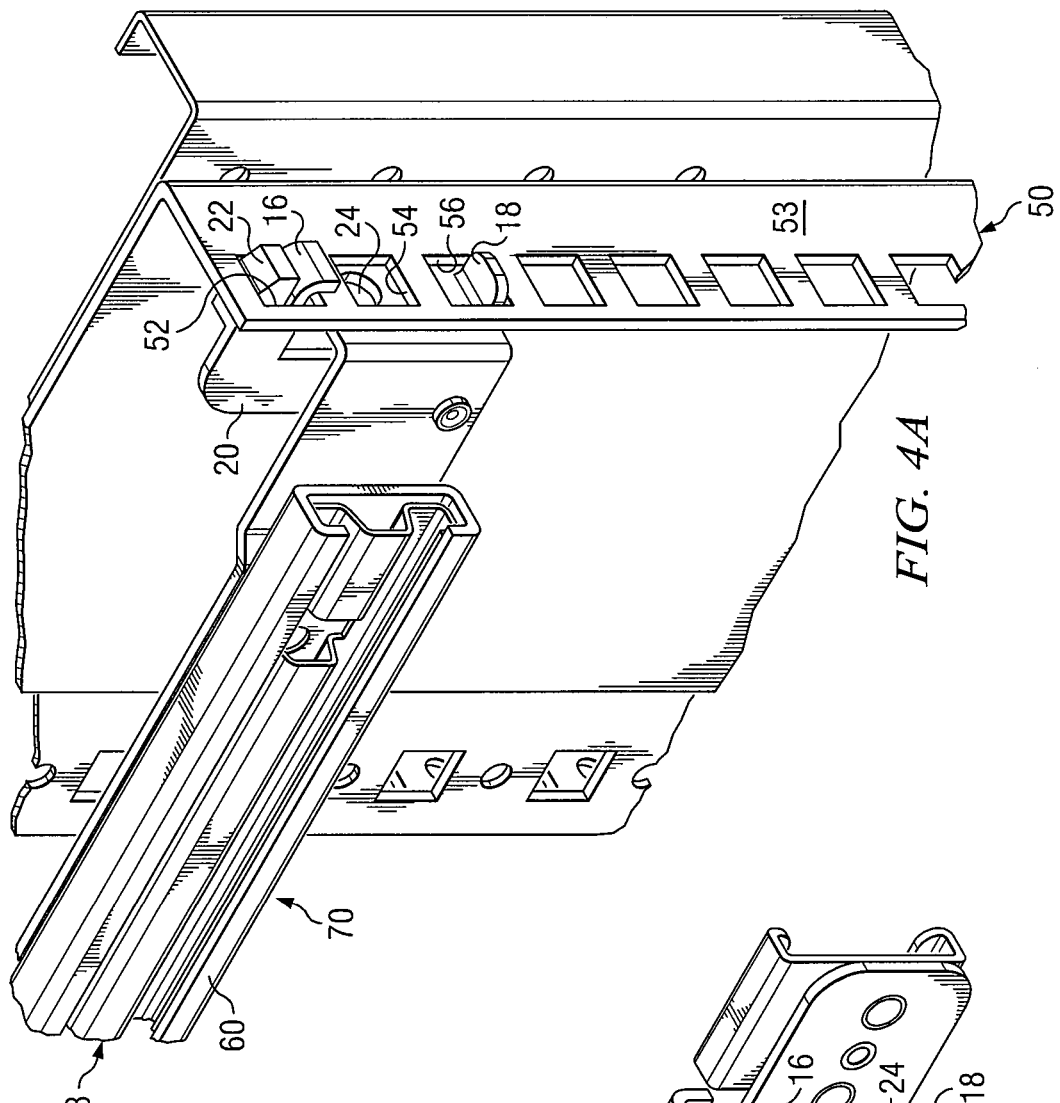
FIG. 4 shows a front end and a rear end of a rack slide assembly.
Figure 4B:
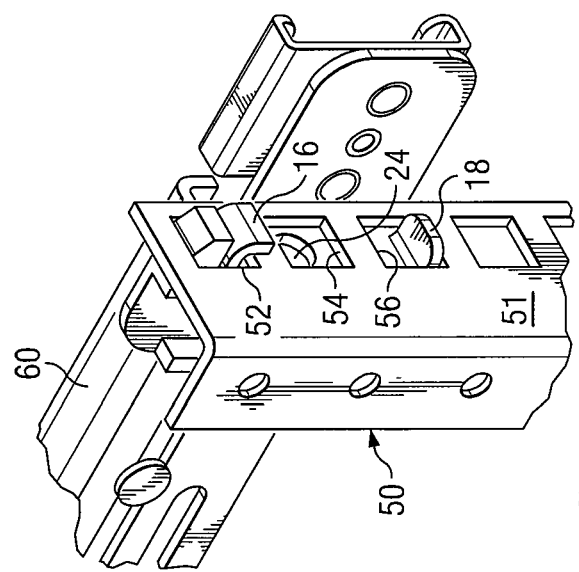

Now referring to FIGS. 4A and 4B which are isometric views of a front end and a rear end of a rack slide assembly 60 attached to a pair of rack rails 50. Specifically, slide assembly 60 is attached to rear rail 51 and front rail 53. Similar to the embodiment shown in FIG. 3, at both ends, locating hooks 16 and locking portions 22 of locking pawl 20 extend through first apertures 52 while the anti-torque tabs 18 extend through third apertures 56. Additionally, outer attachment apertures 24 align with second apertures 54 to allow a loose fastener to secure rack slide assemblies 60 to rack rails 50. In a preferred embodiment rack slide assemblies support information handling system components such as a 1-U information system handling component (e.g. a component that requires 1-U of space within a rack). In some embodiments, the rack slide assemblies may also have a cable management assembly (not expressly shown) associated therewith to hold and manage cabling associated with the information handling system components stored and retained by rack slide assemblies 60.

Figure 5:
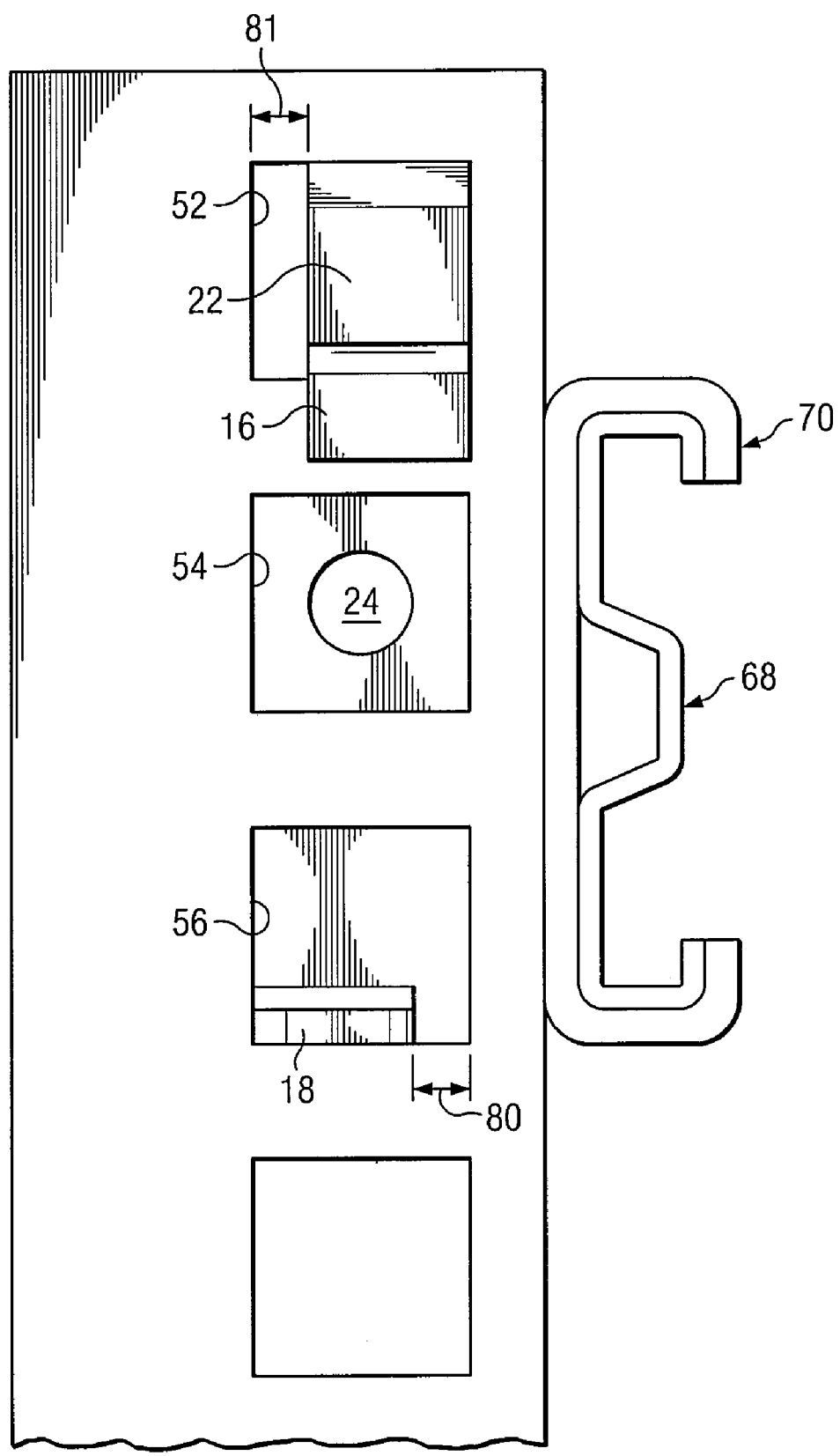
FIG. 5 is an end view of a bracket member installed within mounting apertures of a mounting unit of a rack rail.

Now referring to FIG. 5, an end view of an installed mounting bracket is shown. As shown, locking portion 22 and locating hook 16 extend through first aperture 52. Additionally anti-torque tab 18 extends through third aperture 56. Locking portion 22 and locating hook 16 are laterally offset from anti-torque tab 18. Specifically, locking portion 22 and locating hook are laterally offset 81 within first aperture 52 and anti-torque tab 18 is laterally offset 80 within third aperture 56. In the present embodiment, offset 81 and offset 80 are both exaggerated for demonstrative purposes. For a corresponding bracket installed on the opposite side of the rack, the offset locations would correspond to support anticipated torque loads. In one particular embodiment offset 81 and offset 80 are approximately twenty thousandths of an inch. Offsets 81 and 80 provide at least two advantages: first providing offsets 81 and 80 allows for easier installation of the rack slide assemblies including mounting bracket members 10. Secondly, providing the offset as shown also decreases deflection experienced by bracket member due to the torque exerted on a rack slide assembly during installation or simply from the weight of the information handling system component secured to the rack slide assembly.

In operation, locating hook 16 is aligned with first aperture to ensure side to side placement as well as vertical placement. Anti-torque tab 18 is then aligned with the third aperture 56 at a maximized distance with respect to locating hook 16. Next, the spring assembly of locking pawl assembly 20 urges locking portion 22 into engaged position 23 positioned within first aperture 52 above locating hook 16. Next a fastener such as a chassis attachment screw may be inserted through second aperture 54 and secured to outer attachment aperture. Mounting the threaded fastener through second aperture 54 facilitates scalability and high torque load while ensuring that rack slide assembly 60 may be installed in a 1-U EIA envelope.

Although the disclosed embodiments have been described in detail, it should be understood that various changes, substitutions and alterations can be made to the embodiments without departing from their spirit and scope.

What is claimed is:

1. A mounting bracket for tool-lessly attaching a rack slide assembly to a rack comprising:
   a bracket member having an interface end and an attachment end;
   a locating hook positioned to engage a first aperture within a mounting unit;
   an anti-torque tab positioned to engage a third aperture within the mounting unit; and
   a locking pawl assembly having a locking pawl pivotally movable between a first position and a second position, wherein in the first position a portion of the locking pawl extends through the first aperture within the mounting unit, the locking pawl assembly including a spring assembly operable to urge the locking pawl from the second position toward the first position; and
   wherein an outer attachment aperture of the mounting bracket is positioned to align with a second aperture within the mounting unit when the locating hook engages the first aperture and the anti-torque tab engages the third aperture.

2. The bracket of claim 1 wherein the bracket member further comprises an L-shaped member having a body member and a face member, the face member extending substantially perpendicular to the body member, the locating hook and anti-torque tab extending from the face member.

3. The bracket of claim 1 further comprising the locating hook laterally off-set from the anti-torque tab operable to reduce torque deflection.

4. The bracket of claim 1 further comprising the locating hook and the locking pawl sized to substantially fill the first aperture.

5. The bracket of claim 1 wherein the bracket member further comprises at least two rack arm attachment apertures.

6. The bracket of claim 5 wherein the rack arm attachment apertures comprise elongated slots.

7. A mounting bracket for tool-lessly attaching a rack slide assembly to a rack comprising:
   a first extension positioned to engage a first aperture within a mounting unit;
   a second extension positioned to engage a third aperture within a mounting unit; and
   a locking pawl configured to pivot between a first position and a second position, wherein in the first position a portion of the locking pawl extends through the first aperture within the mounting unit, the locking pawl being urged from the second position toward the first position by a spring assembly; and
   wherein an outer attachment aperture of the mounting bracket is positioned to align with a second aperture within the mounting unit when the locating hook engages the first aperture and the anti-torque tab engages the third aperture.

8. The bracket of claim 7 further comprising an L-shaped member having a body member and a face member, the face member extending substantially perpendicular to the body member, the first and second extensions extending from the face member.

9. The bracket of claim 7 further comprising the first extension laterally off-set from the second extension.

10. The bracket of claim 7 further comprising the first extension and the locking pawl sized to substantially fill the first aperture.

11. The bracket of claim 7 further comprising at least two rack arm attachment apertures.

12. The bracket of claim 11 wherein the rack arm attachment apertures comprise elongated slots.

13. A mounting bracket for tool-lessly attaching a rack slide assembly to a rack comprising:
   means for engaging first and third apertures within a mounting unit;
   an outer attachment aperture positioned to align with a second aperture within the mounting unit when the mounting bracket engages the first and third apertures; and
   a locking pawl assembly having a locking yawl pivotally movable between a first position and a second position, wherein in the first position a portion of the locking pawl extends through the first aperture within the mounting unit, the locking pawl assembly including a spring assembly operable to urge the locking pawl from the second position toward the first position.

* * * * *